Figure 1:
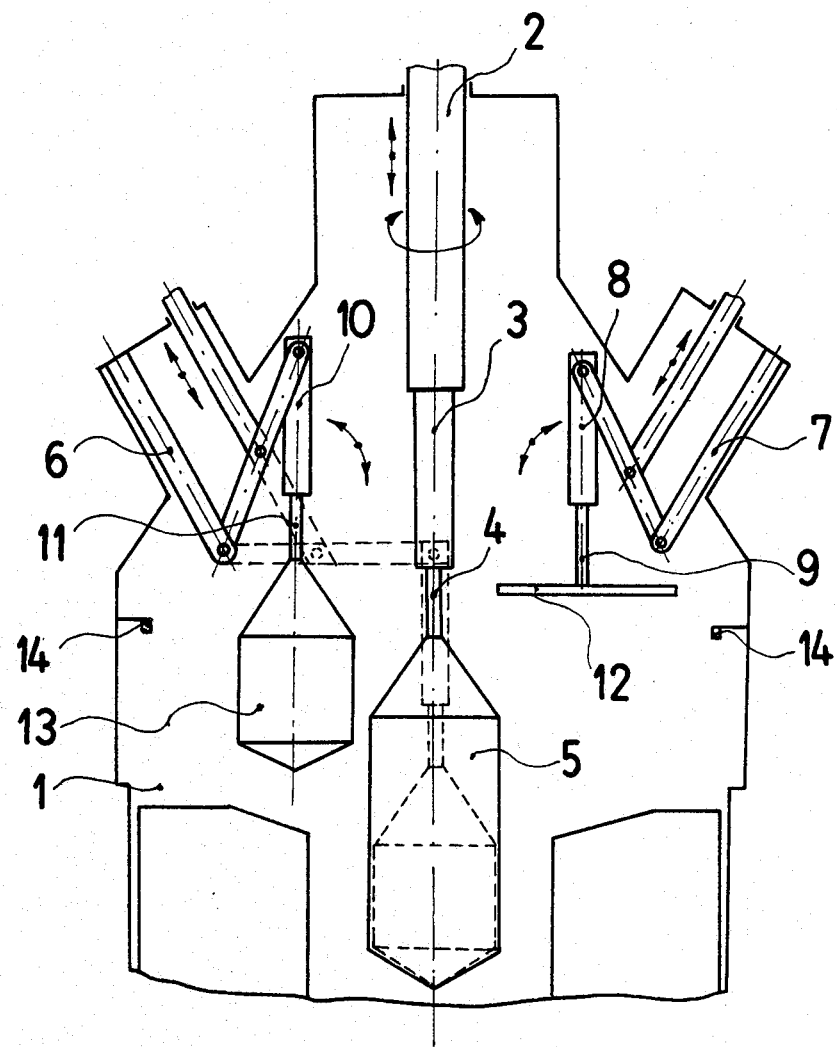

United States Patent [19]

Jablonski et al.

[11] Patent Number: 4,662,982
[45] Date of Patent: May 5, 1987

[54] METHOD OF PRODUCING CRYSTALS OF MATERIALS FOR USE IN THE ELECTRONIC INDUSTRY

[75] Inventors: Marek Jablonski, Warsaw; Bogdan Kwapisz, Grodzisk Mazowiecki; Andrzej Proniewicz, Piastów; Joanna Stepniewska-Jarzebska; Czeslaw J. Tokarski, both of Warsaw, all of Poland

[73] Assignee: Instytut Technologii Materialow Elektronicznych, Warsaw, Poland

[21] Appl. No.: 631,151

[22] Filed: Jul. 17, 1984

[30] Foreign Application Priority Data

Aug. 30, 1983 [PL] Poland .................................. 243556

[51] Int. Cl.⁴ .............................................. C30B 15/10
[52] U.S. Cl. ........................... 156/617 SP; 156/617 V; 156/DIG. 98; 422/249
[58] Field of Search ............. 156/607, 617 SP, 617 V, 156/618, 622, 624, DIG. 98, DIG. 70; 422/249

[56] References Cited

U.S. PATENT DOCUMENTS

| | | | |
|---|---|---|---|
| 4,350,560 | 9/1982 | Helgeland et al. | 156/617 SP |
| 4,410,494 | 10/1983 | Fiegl | 422/249 X |
| 4,485,072 | 11/1984 | Apilat et al. | 422/249 |

FOREIGN PATENT DOCUMENTS

| | | |
|---|---|---|
| 57-179094 | 4/1981 | Japan . |
| 67584 | 9/1973 | Poland . |
| 1027662 | 4/1966 | United Kingdom . |
| 1322582 | 7/1973 | United Kingdom . |
| 1330914 | 9/1973 | United Kingdom . |

Primary Examiner—David L. Lacey
Assistant Examiner—Michael Gzybowski
Attorney, Agent, or Firm—Ladas & Parry

[57] ABSTRACT

The subject matter of the present invention relates to a method of producing crystals of materials for use in the electronic industry. The method provides for growing a crystal from a liquid phase in apparatus for monocrystallization with the use of additional apparatus situated inside a chamber for monocrystallization. The additional apparatus includes inter-chamber manipulators (6) and (7), which aid in carrying out in one crystallization process the multiplication thereof by the use of more than one or many crystal seeds placed in the monocrystallization chamber, whereby a change in the location of seeds (4) and or (9) and or (11) is effected by the manipulators (6) and or (7) controlled from outside of the pressure chamber (1) and by utilization of catches (14) installed inside the pressure chamber (1).

3 Claims, 3 Drawing Figures

METHOD OF PRODUCING CRYSTALS OF MATERIALS FOR USE IN THE ELECTRONIC INDUSTRY

The subject matter of the present invention is a method of producing crystals of materials for use in the electronic industry. The method utilizes an additional apparatus for monocrystallization not known before in the prior art.

The invention is particularly advantageous in the monocrystallization of materials for use in the electronic industry, especially of semi-conductor compounds $A_{III}B_V$, but can be also applied in production of other materials manufactured by Czochralski's method for use in the electronic industry, for example, in the production of monocrystals of silicon.

The range of application of compounds of the group $A_{III}B_V$ is very wide and includes luminescent diodes for both visible light and infra-red, Gunn's diodes, microwave generators, semi-conductor lasers and laser-light modulators, as well as components and electronic systems of different integration scales.

There is a constantly growing demand in the electronic industry for large monocrystals of high quality, at reduced manufacturing costs.

The most well-known method for crystallization of semi-conductor materials is the Czochralski's method, wherein the growth of a crystal is achieved by pulling it from the liquid phase. The charge material for the process of monocrystallization is a polycrystal produced in the process of synthesis. Synthesis of a semi-conducting material can also be performed in separate equipment by the Bridgeman method or by gradient freeze or zonal inductive heating. These methods are ineffective and uneconomical for the following reasons:

the requirement of using two separate devices in the complex cycle of manufacturing monocrystals, only the partial utilization of the crucible volume for monocrystallization which results from the coefficient packing of a polycrystal and the difference in specific gravities of the materials in the solid and liquid phase.

The British patent specification No. 1330914 discloses a method of carrying out the synthesis of semi-conductor compounds $A_{III}B_V$ and $A_{II}B_{VI}$ as follows:

materials to be synthetized are placed in a quartz crucible in a pressure device for monocrystallization and are covered with an encapsulating material, for example, boric oxide $B_2O_3$;

upon closing the device materials are fused under conditions of high pressure and at a temperature exceeding the temperature of the compound and;

after obtaining a homogeneous, fused charge material, under the layer of the encapsulant material, the process of monocrystallization is carried out.

The Polish patent specification No. 67584 discloses a method for synthesis of semi-conductor compounds utilizing monocrystallization apparatus, which is different than that disclosed in the British patent No. 1330914, which steps comprise:

a metallic component is placed in a quartz crucible for monocrystallization together with an encapsulant material as, for example, $B_2O_3$;

a second component, possessing the property of high vapour pressure under conditions of synthesis, is placed in a quartz ampoule above the crucible;

on closing the chamber of the equipment for monocrystallization, pumping it off and filling it with an inert gas, for example, argon, the component is fused together with the encapsulat material in the crucible, after the required fusing of the components in the crucible, the nozzle of the quartz ampoule is immersed to the level of the fused component in the crucible under the fused layer of the encapsulant material and vapors of the component from the ampoule are injected thereto;

on completing the process of synthesis of both components, the ampoule is removed from above the crucible, and the monocrystallization process is realized.

The known methods of carrying out the synthesis have advanced the technological field of manufacturing materials for use in the electronic industry, nevertheless, these methods also have disadvantages.

One of the disadvantages of the above described methods of obtaining materials for electronics use is the contamination in the form of foreign solid bodies originating in the course of synthesis which, when passing to the internal mass of the crystal being produced, cause formation of a polycrystal instead of a good monocrystal.

The equipment for monocrystallization of materials for the electronic industry by Czochralski's method consists of a working chamber, a system of power drives, a vacuum-gaseous system and a process control system. British patent specification No. 1322582 sets forth a device representative of the majority of design solutions. In a chamber, in its lower part, there is a heated crucible on which the charge material for monocrystallization is placed. In the chamber, vertically in the axis thereof, an upper pull rod moves, to which the monocrystal seed is attached on a holder. The crucible and the upper pull rod are put in vertical and rotary motion by external control. At the end of the seed a crystal of definite and limited overall dimensions is formed. After the crystallization process the temperature inside the chamber is lowered and, the pressure is lowered to the value of the external pressure, the crystal is taken out and preparatory operations for the next process are carried out. The method presented in the cited British patent No. 1322852 is both labor and energy-consuming and, therefore, uneconomical.

The object of the present invention is to provide a method of monocrystallization which by utilizing the advantages of a simultaneous monocrystallization synthesis provides improved economic management of the process as well as limiting the idle time for the equipment for monocrystallization.

The essence of the present invention is to carry out in one crystallization process the multiplication thereof by the use of more than one or many monocrystal seeds placed in the chamber of the apparatus for monocrystallization. A change of the location of seed, suspensions, monocrystals or bears of contamination produced in the stage of fusing the charge is effected with the use of inter-chamber manipulators controlled from outside the region of the interior of the crystallization chamber.

The method according to the invention comprises after starting the monocrystallization stage, step-like overcooling the surface of the charge is forced, which causes formation of a flat bear trapping the contamination, and the seed is transferred together with the bear to the neutral part of the chamber. With the second seed, the drawing of the monocrystal is started, and after obtaining it, it is transferred to the neutral part of the chamber. Next, with the subsequent seed the subsequent monocrystallization process is started, and as many monocrystals are obtained as there are many seeds which remain after taking off the bear from the liquid surface of the crystallization charge.

The method according to the invention provides for carrying out multiple monocrystallizations from the same charge in the crucible until the complete exhaustion thereof by passing into the monocrystalline state.

An advantage of the present invention is that collection of any contamination from the surface of the charge liquid being fused promotes monocrystallization without disordering the structure of the monocrystal due to the foreign matters. Additionally, in a typical apparatus it is possible to apply bigger packing of the standard crucible for monocrystallization or to apply a crucible with an increased capacity. Also, from one charge loading it is possible to make a series of single monocrystals which reduces the unit production cost of monocrystals of materials for the use by the electronic industry.

The method of producing monocrystals, according to the present invention, is realized by means of additional devices—inter-chamber manipulators controlled from outside the region of the crystallization chamber.

An example of the use of the
inter-chamber manipulators in the present method is presented in the attached drawings.

FIG. 1 shows the crystallization chamber with the manipulators and the monocrystals being produced along with a polycrystalline bear with contamination.

Figure 2:
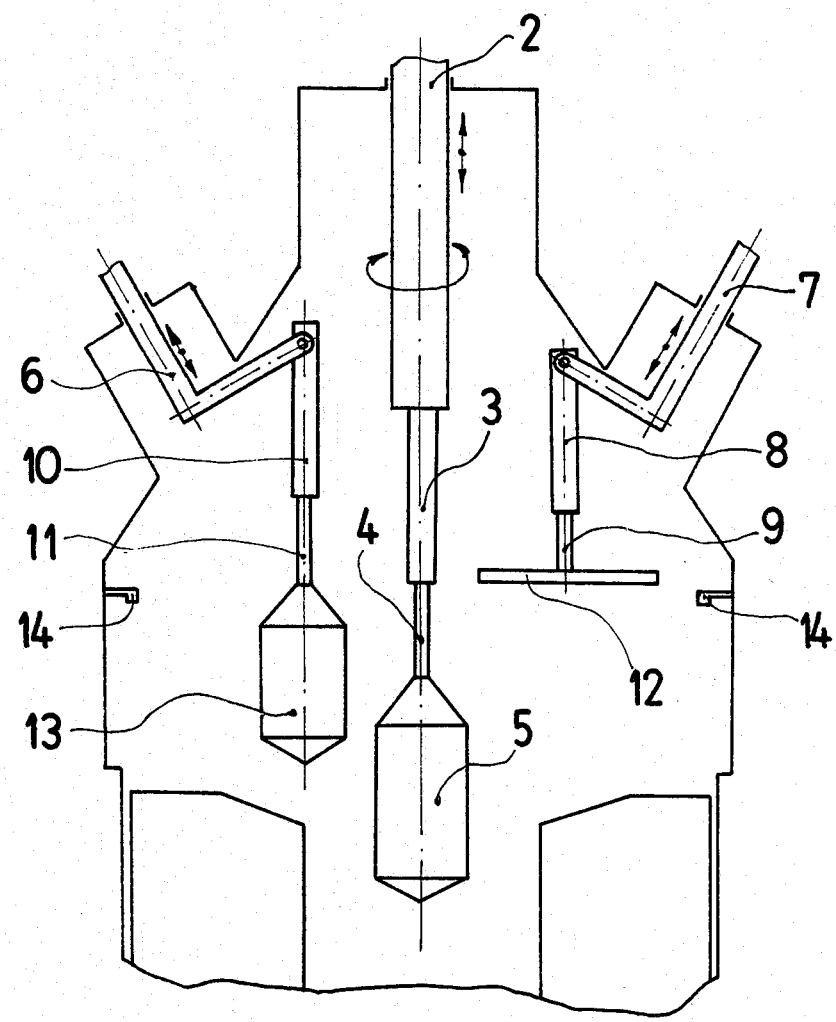
Figure 3:
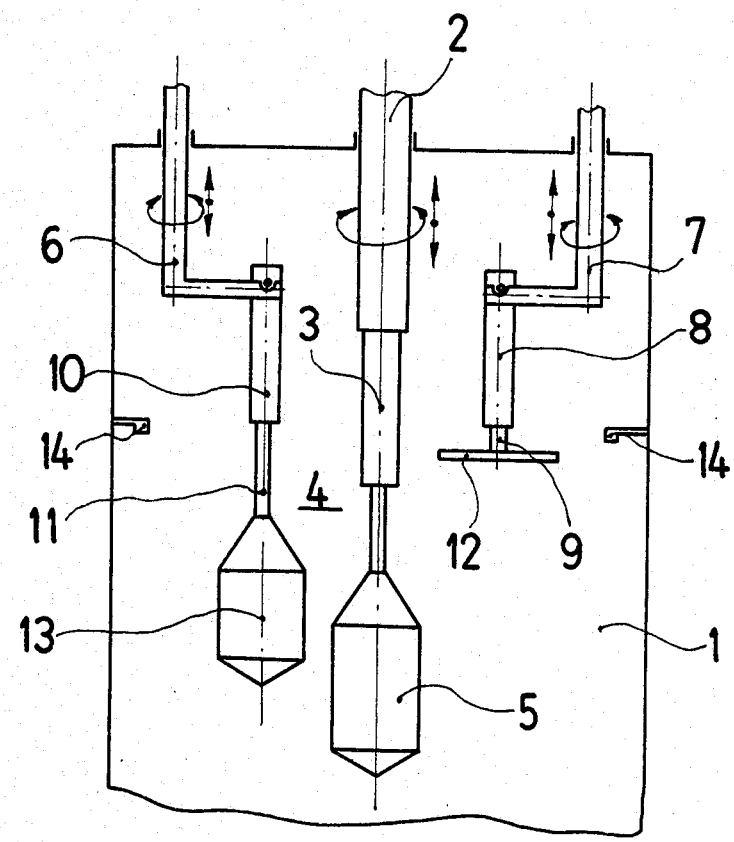

FIG. 2 shows the method of operation of the manipulators in an angular lay-out in relation to the upper pull rod. FIG. 3 shows the operation of the manipulators performing rectilinear and rotary movements. Arabic numerals in the attached drawings FIG. 1, FIG. 2 and FIG. 3 refer to additional devices—inter-chamber manipulators and elements of the crystallization process and have the following meaning: pressure chamber 1, upper pull rod 2, main holder 3, seed on the main holder 4, main crystal 5, manipulator for additional monocrystallization 6, working manipulator 7, additional holder 8, seed for collection of contamination 9, additional holder 10, seed 11 for producing an additional crystal, contamination in the form of a bear 12, additional crystal 13 and catches 14 on walls of the pressure chamber.

In FIG. 1, on the axis of the pressure chamber 1 is situated the upper pull rod 2 which is controlled from the outside, performing plane- and rotary movements. At the and of the pull rod 2 there is the upper holder 3 with main holder 4 for producing the main crystal 5. In the chamber 1 two manipulators 6 and 7 are installed at an angle to the axis of the upper rod, controlled from outside. Push rods of manipulators 6 and 7 perform rectilinear movements, and arms of manipulators perform movements along an arc. The manipulator 7 removes the bear 12 with the contamination to a neutral space, and the manipulator 6 enables additional monocrystallization. In the initial stage of the process, additional holder 8 with the seed 9 is suspended on the main holder 3. The additional holder 10 with the seed 11 for producing an additional crystal is fitted. An arm of the manipulator 7 is free. Arms of both manipulators are withdrawn to the extreme upper position. After fusing the charge in the crucible, the upper pull rod 2 is lowered and at the end of the seed the contamination in a form of the flat bear 12 accumulates. Next, upper pull rod 2 with the bear 12 rises. The arm of the manipulator 7 lowers and the bear with the contamination 12 is collected together with the seed 9 and the additional holder 8 and they are withdrawn to the neutral position. Subsequently, the arm of the manipulator 6 lowers and hangs an additional holder 10 together with the seed 11 of the manipulator for producing an additional crystal on the holder 3 on the upper pull rod 2. After withdrawing the arm of the manipulator 6, the upper pull rod 2 lowers an additional crystal 13 is produced on the seed 11 transferred from the manipulator 6. The upper pull rod 2 together with the additional crystal 13 rises and the arm of the manipulator 6 lowers to collect the additional crystal 13 together with the seed 11 and the additional holder 10. They are then withdrawn to the neutral position. In the final stage of the process the upper pull rod 2 lowers and the main crystal is produced at the end of the seed 4. In chamber 1 of the apparatus special catches 14 are installed, and suspended thereon is both the additional holder itself with a corresponding nucleus as well as the additional holder with nucleus and the bear with contamination, or the additional holder with a seed and an additional crystal. One or more inter-chamber manipulators are placed in the chamber. The arms of the manipulators suspend or collect additional holders with seeds and an eventual bear or resulting crystal, both from the main holder placed on the main pull rod and from catches 14 arranged in neutral zones inside the pressure chamber 1.

EXAMPLE 1

The method according to the invention is realized by placing in the chamber of the apparatus for monocrystallization three seeds for monocrystallization and a crucible for fusing initial materials for monocrystallization. 810 g of gallium, 890 g of arsenic and 185 g of boric trioxide are placed in the crucible. After closing the chamber and pumping off the air, it is filled with an inert gas, for example, argon to the pressure of about 40 atmospheres, and the synthesis of the gallium arsenide GaAs is carried out by fusing the initial materials. On obtaining a fused polycrystal under the layer of fused $B_2O_3$, temperature and pressure conditions are established, characteristic of the monocrystallization process. The seed suspended on the upper pull rod is lowered into contact with the surface of the charge, and next, the charge is superficially overcooled by steps. The GaAs bear formed as the result of the temperature decrease traps unfused foreign matters remaining after the process of synthesis. Next, by a quick shift the seed is raised together with the GaAs bear on the weight of about 10–15 g above the surface of $B_2O_3$ and is removed from above the surface of the crucible. About 1685 to 1690 g of fused polycrystal remains in the crucible. After restoring the temperature and pressure conditions to those characteristic of the monocrystallization process, the monocrystallization process is conducted with the use of a second seed suspended on the upper pull rod of the apparatus. When a monocrystal of the diameter of 40 to 45 mm reaches the weight of about 700 g, it is terminated with a cone and, after raising it above the $B_2O_3$ layer, it is removed to the neutral space of the chamber. In the crucible about 980 g of polycrystal remains. With the use of a third seed suspended on the upper pull rod of the apparatus, the subsequent monocrystallization process is conducted to obtain a monocrystal of the diameter of 40 to 45 mm and the weight of about 960 g, terminated with a cone. A residue of the charge remains in the crucible, of the weight of about 20 g. The process thus conducted enables producing more than one monocrystal of GaAs due to the application of an additional device, that is, the inter-chamber manipulator which enables carrying out the method of obtaining crystals for electronic industry according to the essence of the invention. Obtaining greater number of monocrystals thhan two in one crystallization process can be performed depending on the number of seeds placed inside the crystallization chamber and on the capacity of the crucible for fusing the initial materials.

The method of producing crystals of materials for the electronic industry according to the invention gives considerable power savings, limits to a considerable extent the time of producing the final crystallization product and increases unit yields of producing electronic materials.

The invention has a wide application range in the electronic industry, wherever monocrystals for electronics are produced.

What is claimed is:

1. In a method of producing monocrystals of materials by pulling of monocrystals from a liquid phase, produced in a crucible in a chamber as the result of the therein on materials initially charged therein, and utilizing mechanical vertical movements of a seed which provides for the overgrowth of a crystal, and rotary movements to obtain homogeneity thereof, wherein the improves process comprises employing multiple crystallization by using, in turn, one of several seeds placed inside side chamber and growing single crystals from said seeds by employing at least one of several manipulators located inside said chamber, wherein said improved process of multiple crystallization comprises melting a charge of an initial material in the crucible and allowing the superficial overcooling thereof; removing superficial contamination from the charge and forming a bear containing the contamination by placing a first seed in a holder which is suspended on an upper pull rod above the crucible; shifting the holder holding the first seed so as to control the contamination and placing the first seed and the bear onto a catch in a neutral part of the chamber by employing one of said manipulators; thereafter suspending a second seed placed in an additional holder onto the upper pull rod and continuing the crystallization process to form a single crystal from the second seed; moving said formed single crystal together with the second seed in the additional holder to the neutral part of the chamber onto another catch by employing one of said several manipulators and repeating the monocrystallization process on additional seeds inside the chamber together with moving single crystals formed in succession on them to the neutral part of the chamber onto other catches by employing said manipulators; and pulling a final single crystal formed on a third seed fixed on the main holder of the upper pull rod.

2. The method according to claim 1, wherein said manipulators have arms and prior to the crystallization process, the seeds in the holders are fixed inside the chamber for growing of a single crystal in such a way that one of them is attached to the upper pull rod, and the other seeds are suspended on the arms of the manipulators or on said catches inside the chamber.

3. The method according to claims 1 or 4, wherein the movement of the additional holders with the seeds and the bear of contamination for growing single crystals is carried out inside the crystallization chamber by employing said manipulators which are controlled from outside the chamber.

* * * * *